United States Patent
Gnauck et al.

(10) Patent No.: US 7,462,839 B2
(45) Date of Patent: Dec. 9, 2008

(54) DETECTOR FOR VARIABLE PRESSURE AREAS AND AN ELECTRON MICROSCOPE COMPRISING A CORRESPONDING DETECTOR

(75) Inventors: Peter Gnauck, Reutlingen (DE); Volker Drexel, Königsbronn (DE); David Bate, Bucks (DE); Eric Essers, Aalen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 78 days.

(21) Appl. No.: 10/500,951

(22) PCT Filed: Jun. 29, 2001

(86) PCT No.: PCT/EP01/07431

§ 371 (c)(1),
(2), (4) Date: Dec. 30, 2003

(87) PCT Pub. No.: WO02/05309

PCT Pub. Date: Jan. 17, 2002

(65) Prior Publication Data

US 2005/0173644 A1    Aug. 11, 2005

(30) Foreign Application Priority Data

Jul. 7, 2000   (DE) ............... 109 32 599
May 31, 2001  (DE) ............... 101 26 698

(51) Int. Cl.
*H01J 37/28* (2006.01)

(52) U.S. Cl. .................. 250/397; 250/310

(58) Field of Classification Search ........... 250/310, 250/397
See application file for complete search history.

(56) References Cited

U.S. PATENT DOCUMENTS

| 4,785,182 A | 11/1988 | Mancuso et al. |
| 4,897,545 A * | 1/1990 | Danilatos ........... 250/310 |
| 4,992,662 A | 2/1991 | Danilatos |
| 5,396,067 A * | 3/1995 | Suzuki et al. ....... 250/310 |
| 6,590,210 B1 * | 7/2003 | Essers ............... 250/310 |
| 6,707,041 B2 * | 3/2004 | Essers ............... 250/310 |

FOREIGN PATENT DOCUMENTS

| DE | 4009692 | 10/1990 |
| JP | 11 096956 A | 4/1999 |
| WO | WO 98/22971 | 5/1998 |

OTHER PUBLICATIONS

International Search Report for PCT/EP0L/07431 dated May 10, 2001.

* cited by examiner

*Primary Examiner*—Kiet T Nguyen

(57) ABSTRACT

A detector for scanning electron microscopes, which can be used under different pressure conditions in the specimen chamber of the electron microscope, designed for the detection of both electrons and light. For this purpose, the detector has a photodetector and a scintillator of a material transmissive for visible light connected before the photodetector. The scintillator can be provided with a coating transparent to visible light. By the application of different potentials, the detector is suitable for the detection of electrons in high vacuum and for the detection of light with high pressures in the specimen chamber.

24 Claims, 3 Drawing Sheets

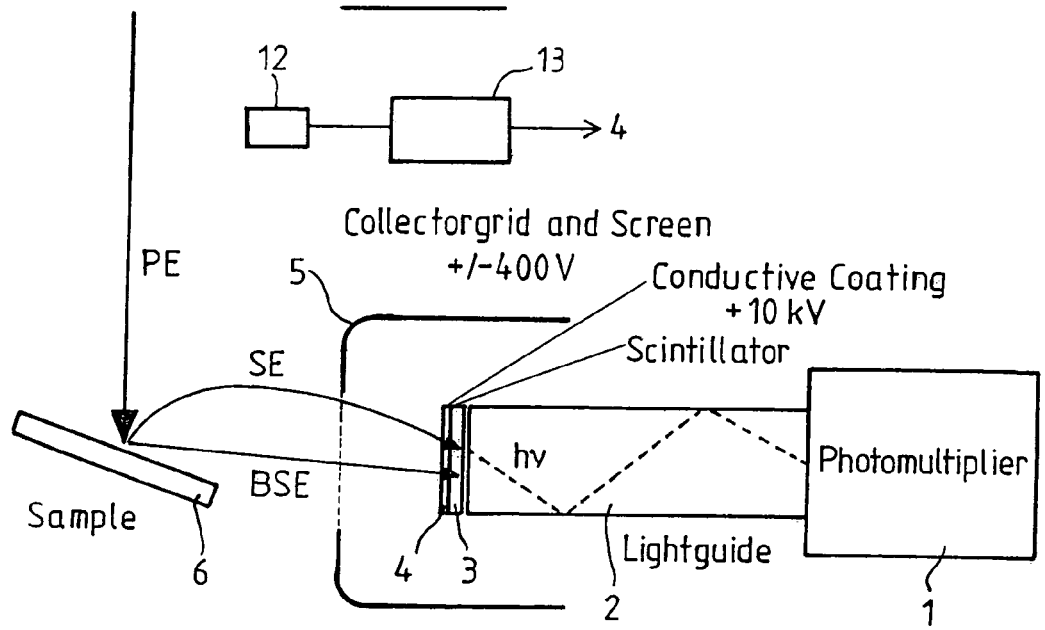
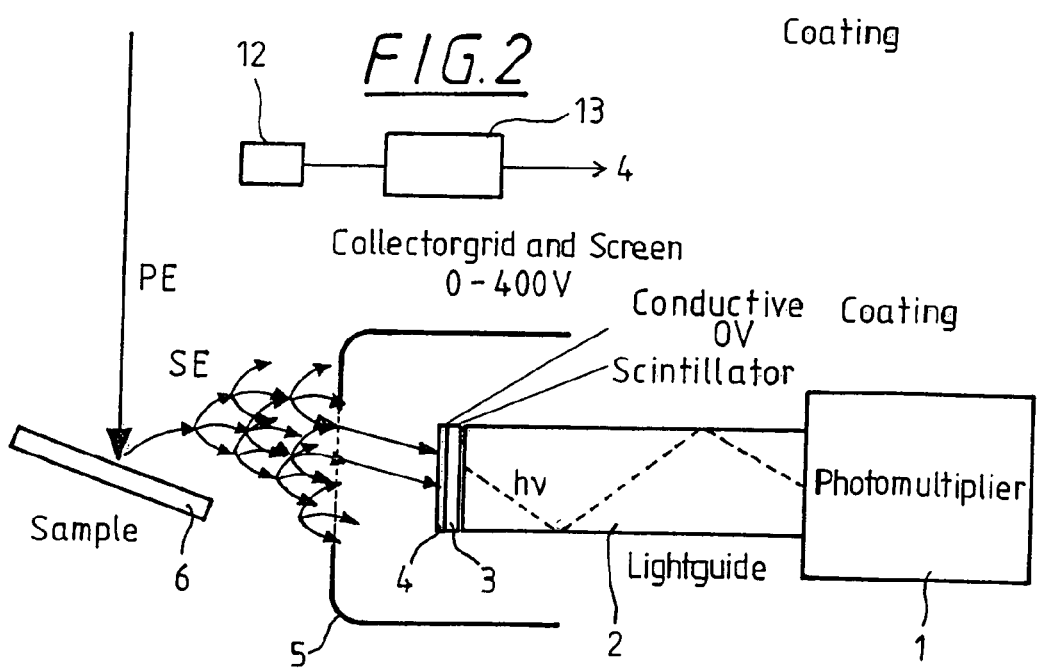

DETECTOR FOR VARIABLE PRESSURE AREAS AND AN ELECTRON MICROSCOPE COMPRISING A CORRESPONDING DETECTOR

CROSS-REFERENCES TO RELATED APPLICATIONS

This application is a 371 of PCT/EP01/07431 claiming priority of German Patent Applications 100 32 599.8 filed Jul. 7, 2000 and 101 26 698.7 filed May 31, 2001.

Not applicable.

STATEMENT REGARDING FEDERALLY SPONSORED RESEARCH OR DEVELOPMENT

Not applicable.

BACKGROUND OF THE INVENTION

The invention relates to a detector for the interaction products, particularly backscattered electrons and secondary electrons, produced in a particle beam device by interaction of a primary beam with a sample to be investigated.

Usually used for the detection of secondary electrons or backscattered electrons in scanning electron microscopes are so-called Everard-Thornley detectors (ETD), in which the secondary electrons or backscattered electrons released at the sample interface are attracted away from the sample to the detector by an extraction grid and then accelerated to a scintillator having a high voltage of about 10 kV. When the highly kinetic electrons strike the scintillator, photons are produced which can be fed to a photodetector, for example a photomultiplier, by means of a transparent light guide.

Such Everard-Thornley detectors cannot be used with varying gas pressures in the region of the detector, particularly when the ambient pressure of the detector is above $10^{-3}$ hPa, since the increased conductivity of the residual gas leads to overstrikes at the high voltage applied to the scintillator.

At pressures above $10^{-3}$ hPa in the sample chamber, for indirect detection of the secondary electrons released by the primary beam, an extraction potential of up to 400 V is applied to an electrode in order to accelerate the released secondary electrons away from the sample. A gas cascade thereby results from collisions of the secondary electrons. Further, tertiary electrons arise in this gas cascade, and also photons from scintillation effects. Signal detection then takes place either by the measurement of the electron current or by the detection of the photons. Corresponding detection principles are described, for example, in U.S. Pat. No. 4,785,182 and WO 98/22971.

Devices which are designed for operation at varying pressure conditions in the sample chamber, and in which the electron microscopic investigation of samples can thus take place both under ultra-high vacuum conditions and also under so-called ambient conditions, in which the pressure in the sample chamber is above $10^{-3}$ hPa, have to have different detectors for the different modes of operation.

From Japanese Patent Document P 11-096956 A, a detector for scanning electron microscopes is known in which the same photodetector is used both for detection of cathode luminescence and also for the detection of backscattered electrons. For this purpose, the detector has a scintillator attached to a light guide and having a convex, mirror-coated end. The backscattered electrons penetrate into the mirror layer and produce light flashes in the scintillator which are detected by the photodetector; cathode luminescence, on the other hand, is focused by the reflecting surface of the scintillator onto another light inlet surface of the light guide.

In this detector it is however disadvantageous that the scintillator has to be arranged between the sample and the objective lens of the scanning electron microscope, so that a correspondingly greater working distance is necessary between the objective lens and the sample; because of the resulting scattering of the electrons by gas molecules, this detector is unsuitable for uses with high pressures in the sample chamber. Moreover, the scintillator is disturbed by a tilting of the sample.

An Everard-Thornley detector is described in German Patent Document DE 40 09 692 A1, its surface being provided with a metal grid. The metal grid acts, among other things, to prevent the presence of surface charges on the non-conducting scintillator. A use of the detector at different pressures in the sample chamber is not mentioned there.

SUMMARY OF THE INVENTION

The object of the present invention is therefore to provide a detector that can be used both under high vacuum conditions and also at high pressures in the sample chamber of an electron microscope.

This object is attained by a detector for varying pressure ranges in a specimen chamber of a particle beam device, wherein the detector is arranged and adapted for detection of electrons and light. Advantageous embodiments of the invention will become apparent from the features of the dependent claims.

A detector according to the invention is designed both for the detection of electrons and for the detection of light. The detection of electrons takes place indirectly here by means of photons produced in a scintillator and subsequently detected in a photodetector.

In an advantageous embodiment example, the scintillator can be placed at a high voltage potential, and is made transmissive for light in a spectral region, preferably in the visible spectral region. For placing the scintillator at a high voltage potential, the scintillator can be provided with an electrically conductive coating in grid or strip form. Alternatively, an electrically conductive coating which is transmissive for visible light can be provided.

The detector is furthermore to have a collector grid which is arranged on the side of the scintillator remote from the photodetector and likewise can be placed at a potential. The scintillator and the collector grid are to capable of being placed at controllable voltages independently of each other.

The mode of operation of a corresponding detector under high voltage conditions is analogous to the mode of operation of an Everard-Thornley detector. For this, the scintillator is acted on with a potential of about 10 kV (between 5 kV and 15 kV) under high vacuum conditions, so that the high-energy electrons striking the scintillator produce photons which are then detected by the photodetector. At pressures in the sample chamber above $10^{-3}$ hPa, either the collector grid or the scintillator, or both, is/are placed at a low potential between 50 V and 1,000 V, preferably between 100 and 500 V, so that the secondary electrons or backscattered electrons released from the sample by the primary electrons produce a gas cascade with scintillation effects on the path from the sample to the scintillator or collector grid. The photons produced in the gas cascade are then detected by the photodetector by means of the transparent scintillator coating. The value of the voltage applied to the scintillator or to the collector grid is dependent on the chosen pressure in the sample chamber, and on geometrical factors.

By varying the voltage on the collector grid, it is additionally possible to differentiate between secondary electrons and electrons backscattered at the sample. If both the collector grid and the scintillator are at the same potential as the sample, no gas cascade arises and the light signal detected by the photodetector through the transparent scintillator is a signal that depends exclusively on the electrons backscattered at the sample.

In a further advantageous embodiment, the detector has a light guide. The light guide can itself consist of scintillator material. Such a light guide serves to efficiently conduct photons produced in the scintillator to the photodetector.

In a further advantageous embodiment, the collector electrode is formed as a needle electrode or as a thin wire. Moreover, further electrodes can be provided, which surround the scintillator and the collector electrode in pot form and thereby form in their interior a detection chamber which communicates with the sample chamber through a small aperture.

At high pressures in the environment of the detector, in addition to the light signal, the electron current on the extraction grid and/or on the electrically conductive coated scintillator can be detected.

BRIEF DESCRIPTION OF THE DRAWINGS

Details of the invention are explained in detail hereinafter using the embodiments shown in the accompanying drawings.

FIG. 1 shows, in section, a sketch of principle of a detector according to the invention, in operation in high vacuum;

FIG. 2 shows the detector of FIG. 1 in operation in a pressure range above $10^{-3}$ hPa;

DETAILED DESCRIPTION OF THE INVENTION

Figure 3:
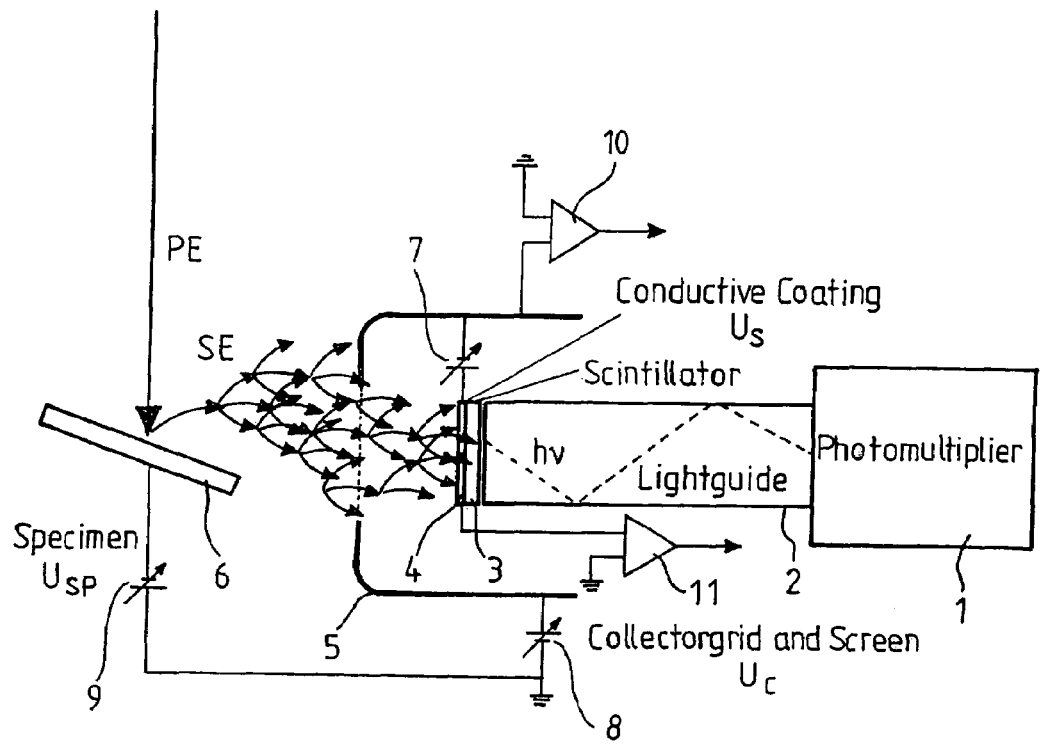
FIG. 3 shows a further embodiment of the detector according to the invention in operation in a pressure range above $10^{-3}$ hPa.

The detector in FIG. 1 contains a photodetector (1), for example in the form of a photomultiplier or an avalanche photodiode, and a light guide (2) connected before the photodetector (1), and a scintillator (3) connected to the end face of the light guide (2) remote from the photodetector (1).

It should be mentioned here that the light guide (2) is not absolutely necessary, but the scintillator can instead be installed directly before the photodetector (1). In this case the photodetector (1) of course has to be arranged within the specimen chamber of the electron microscope, while with the light guide (2), the photodetector can be arranged outside the specimen chamber, since light produced within the specimen chamber is guided by the light guide (2) to the photodetector (1).

Furthermore, it should be mentioned here that the light guide (2) itself can also be constructed as a scintillator, so that a separate scintillator layer (3) can be dispensed with.

The scintillator (3) consists of a material transparent to visible light, for example, a conventional plastic scintillator. The scintillator (3) is provided on the side remote from the photodetector (1) with a coating (4) which is electrically conductive and is transmissive for visible light. The electrically conductive coating (4) can be formed for this as a conventional metal layer, which is applied to the end face of the light guide (2) in grid or strip form or as a thin metal film, for example of titanium or gold, having a thickness between 5 nm and 30 nm, preferably a thickness between 3 and 30 nm.

Alternatively a transmissive coating with an electrically conductive material that is transmissive for light, for example ITO [indium tin oxide], is concerned.

The unit of light guide (2), scintillator (3), and transparent, electrically conductive coating (4) is surrounded by a collector grid (5) at a spacing.

A pressure sensor (12) is arranged in the sample chamber, measures the pressure in the sample chamber, and controls the application of potential to the scintillator (3) and/or to the collector grid (5) in dependence on the chamber pressure, by means of a control (13).

Under high vacuum conditions, i.e. at pressures in the specimen chamber below a changeover pressure which is between $10^{-3}$ hPa and $10^{-2}$ hPa, a potential of 5 kV-15 kV is applied to the scintillator (3) or to the electrically conductive, transparent coating (4) of the scintillator (3). The collector grid (5), according to whether backscattered electrons (BSE) produced at the sample (6) or secondary electrons (SE) produced at the sample (6) are to be detected, has a potential applied to it of about 400 kV and of reversible polarity. If the detection of backscattered electrons (BSE) is desired, a potential that is negative with respect to the sample (6) is applied to the collector grid. The secondary electrons, which emerge from the sample (6) with a small energy of a few electron volts, are kept away from the scintillator (3) by the collector grid due to this negative potential. Consequently, only those electrons strike the scintillator (3) that can overcome the counter-potential of the collector grid because of their higher kinetic energy. These are the electrons which were backscattered at the sample (6). These backscattered electrons are accelerated between the collector grid (5) and the scintillator (3) and because of their high energy produce photons in the scintillator (3), to be conducted by the light guide (2) to the photodetector (1) and detected there.

If the detection is desired of the secondary electrons released from the sample (6) by the primary electrons PE, a positive potential with respect to the potential of the sample (6) is applied to the collector grid (5). The secondary electrons released from the sample (6) are extracted by means of this positive potential of the collector grid and are then accelerated between the collector grid (5) and the scintillator (3) to the scintillator potential. In this case, the accelerated secondary electrons, because of their high kinetic energy, also release photons from the scintillator (3), to then be detected by the photodetector (1). Admittedly, with a positive potential of the collector grid with respect to the sample potential, electrons backscattered at the sample (6) also strike the scintillator (3); however, only a very small solid angle is subtended by all the electrons backscattered at the sample (6), while the secondary electrons, due to their lower kinetic energy when they leave the sample (6), are detected almost independently of the direction in which they leave the sample (6). Because of this, the signal detected by the photodetector (1) when the collector grid potential is positive with respect to the sample potential is primarily determined by the secondary electrons leaving the sample (6), while the electrons backscattered at the sample (6) cause only a comparatively small signal background.

When the detector is operated under high chamber pressures (FIG. 2), the scintillator (3) is at the potential of the sample (6). The collector grid at the same time has applied to it a variable potential between 0 and +400 V with respect to the potential of the sample (6). If only the detection of the electrons backscattered at the sample (6) is desired, the collector grid is placed at the potential of the sample (6). The electrons backscattered at the sample (6) and striking the scintillator (3) because of their backscattering angle again produce photons in the scintillator (3), as in high vacuum operation, because of their relatively high kinetic energy, and the said photons are detected by the photodetector (1). If on the contrary the detection of secondary electrons is desired, the collector grid is placed at a potential which is positive with respect to the sample potential (6). The secondary electrons leaving the sample (6) are then accelerated toward the collector grid and produce the known gas cascade and the photons simultaneously leaving the gas cascade, by collision with the gas atoms on this path. These photons pass through the electrically conductive coating (4), which is transparent to visible light, and the scintillator (3), likewise transmissive for visible light, and are then conducted by the light guide (2) to the photodetector (1). Additionally or alternatively to detecting the photons produced, the electron current produced by the gas cascade and detected with the collector grid or with the electrically conductive coating (4), can be made use of for signal recovery in this mode of operation.

The changeover of the application of potential to the scintillator takes place automatically by the control (13) in dependence on the pressure in the sample chamber determined by the pressure sensor (12). If the chamber pressure exceeds the preset changeover pressure, the scintillator potential is automatically switched off or reduced, so that voltage overstrikes are excluded; if the chamber pressure falls below the changeover pressure, the preset scintillator potential is again applied to the scintillator (3).

The detector in FIG. 3 has in principle the same construction as the detector in FIG. 1. The components in FIG. 3 that correspond to those in FIG. 1 are therefore given the same reference numerals. Reference is therefore made to the previous description of FIG. 1 for a detailed description of these components and of the operation of this detector in high vacuum.

In the embodiment according to FIG. 3, in addition to the voltage source (8) for the application of potential to the collector grid (5) and a voltage source (9) for setting a variable sample potential, a further voltage source (7) is provided by means of which the electrically conductive coating (4) of the scintillator (3) can be placed at a positive potential US with respect to the collector grid (5). The potential of the electrically conductive coating (4) with respect to the collector grid (5) is thus variable. By applying this additional voltage US between the electrically conductive coating (4) of the scintillator (3) and the collector grid (5), a further gas cascade is formed between the collector grid (5) and the scintillator (3). For signal recovery, both the light signal detected with the photodetector (1), and also the electron current on the collector grid (5) and/or on the electrically conductive coating (4) can furthermore be detected, for which purpose a corresponding current amplifier (10) is connected to the collector grid (5) and a second current amplifier (11) is connected to the electrically conductive coating (4). By variation of the voltage of the collector grid (5) with respect to the sample potential on the hand, and the voltage between the electrically conducting coating (4) and the collector grid (5), a distinction can be made with higher accuracy, as compared with the embodiment according to FIGS. 1 and 2, between the signals produced by secondary electrons and the signal produced by backscattered electrons.

In particular it is also possible in this embodiment to place the collector grid (5) at only such a weakly positive potential with respect to the sample potential, and the conductive coating (4) of the scintillator at such a high positive potential with respect to the collector grid (5), that the secondary electrons coming from the sample are indeed efficiently extracted by the potential of the collector grid, but however no gas cascade, and the secondary electron multiplication associated with it, arises between the sample and the collector grid, but the gas cascade first arises between the collector grid (5) and the scintillator. Since the gas cascade is thereby localized in the neighborhood of the scintillator and the photons arising when the gas cascade is formed arise in this localized space, the detection of the photons takes place with a higher efficiency. Furthermore, by a separate control of the pressure between the collector grid and the scintillator, e.g. by constructing the collector grid as a pot with a relatively small aperture facing toward the sample and forming a "pressure stage diaphragm", and by means of a specific gas inlet into the interior of the pot, it is possible to set a pressure, deviating from the chamber pressure and to a certain extent independent, between the collector grid and the scintillator. A formation of the gas cascade that is to this extent independent of the pressure in the chamber, and a correspondingly independent amplification of the secondary electrons and photons, thereby result. A multiplication of the secondary electrons can also be attained by these measures when the pressure in the specimen chamber is itself too small for the formation of a gas cascade.

Figure 4:
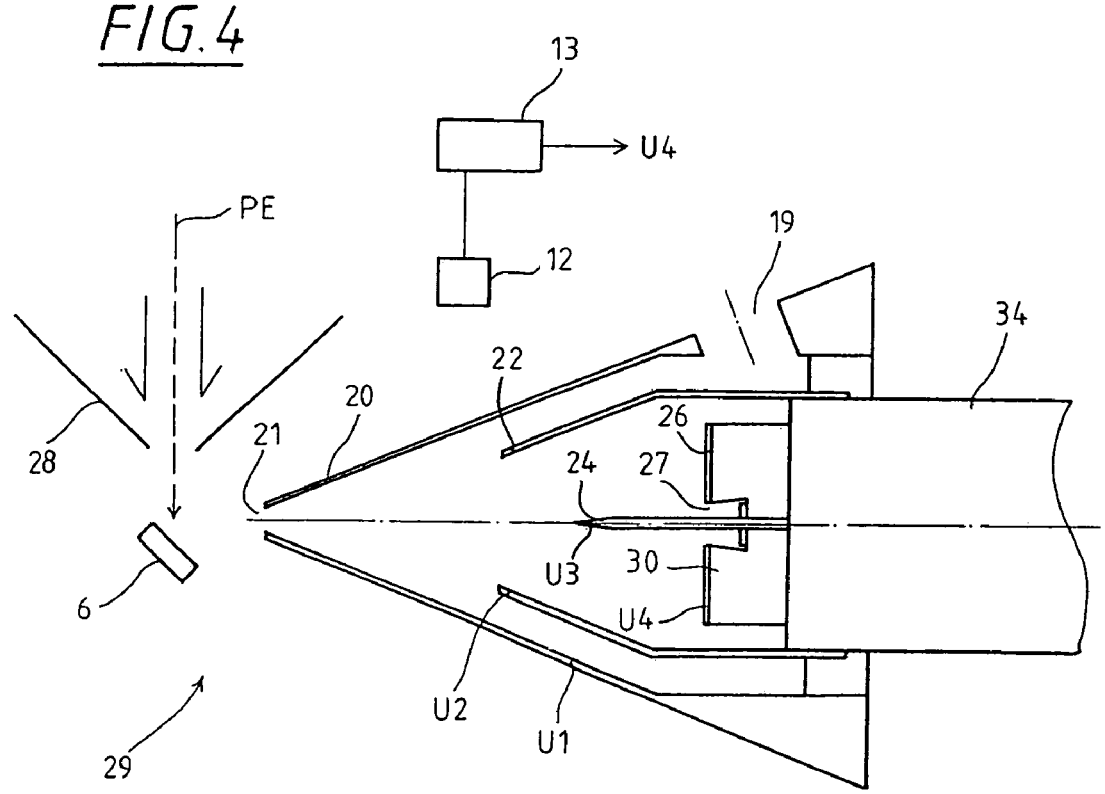
FIG. 4 shows a third embodiment example of a detector according to the invention.

The embodiment in FIG. 4 has a similar construction as the embodiment example in FIG. 3, but is formed tapering conically to a point in the direction toward the sample, and thus on the side remote from the photodetector. It has a light guide (34), on which a scintillator (30) is set on the sample side. The scintillator (30) is provided on the sample side with an electrode (26), transmissive to light and formed either as a thin metal layer or in grid form.

A needle electrode (24) tapering to a point on the sample side and extending in the direction of the sample is received in a central recess (27) in the sample-side front surface of the scintillator (30). The recess (27) serves exclusively for the electrical insulation of the needle electrode (24) with respect to the scintillator electrode (26).

A middle electrode (22) is received externally on the light guide (34) and surrounds the needle electrode (24) in pot form, and is formed conically converging on the sample side, so that a sample-side aperture (23) with an aperture diameter between 0.5 and 5 mm results for the entry of electrons. The middle electrode (22) is mirror-coated on the inside.

In a special embodiment of the embodiment, the inner electrode (22) is surrounded by yet another outer electrode (20), likewise running to a point in the direction toward the sample and likewise forming an inlet aperture (21) on the sample side. Between this outer electrode (20) and the middle electrode (22), the gas and its pressure in this interspace can be set by means of a gas inlet (19), partially independently of the gas and pressure in the sample chamber. When a somewhat higher prevails in the detection chamber, and thus in the interspace between the middle electrode (22) and the outer electrode (20), than in the sample chamber, this has the advantage that the gas diffusing out of the sample chamber into the detection chamber is constantly flushed out of the detection chamber again.

The outer electrode (20) serves on the one hand to screen off with respect to the primary electron beam (PE) the high voltage potential that is applied to the scintillator electrode (26) in high vacuum operation. Furthermore the outer electrode (20) serves for attracting secondary electrons from the sample to the aperture (21). By means of the tapering constructional form of the outer electrode (20), the undesired signal contribution due to secondary electrons produced by backscattered electrons in the gas of the sample chamber is kept as low as possible, since only such secondary electrodes pass through the aperture which are situated at not too great a distance from the aperture, i.e., the weak far field of the pointed outer electrode makes sure that the secondary electrons pass through the aperture (21) only from a narrowly limited volume.

The potential U1 of the outer electrode (20) is to be adjustable in a range of 0-500 V positive with respect to the sample. A strongly positive potential over 200 V has the advantage that a gas cascade is thereby produced in the sample chamber and runs to the aperture (21) of the outer electrode. The detector efficiency is thereby increased, in that more electrons reach the detection chamber. Furthermore, the electrode which enter the detection chamber—particularly with not too high a gas pressure—have a higher average kinetic energy, so that they are little affected by the transverse component of the electric field—transverse of the rotation axis of the detector—which pushes the electrons from inside to the outer electrode. With a weak positive potential below 50 V positive with respect to the sample, a more favorable course of the electrical field can be set, in which the secondary electrons, during or after passing across the aperture (21), are pushed little or not at all against the outer electrode (20).

For reducing the indirect signal portion which is provided by the backscattered electrons due to those secondary electrons which are produced by collision of the backscattered electrons with the pole shoe (28) of the objective lens, it is helpful if the potential of the sample is slightly, i.e., about 50 V, negative with respect to the potential of the pole shoe. By a wire gauze electrode at sample potential (or at another potential, which is nearer to the potential of the sample than to the potential of the pole shoe), between the sample and the pole shoe, it can be attained that the space immediately above the pole shoe is nearly field-free and the extraction of the secondary electrons by the further electrode (20) is not adversely affected.

The middle electrode (22) likewise serves to keep small the proportion of secondary electrons that are pushed against the outer electrodes, in that the secondary electrons after entering the detection chamber are further deflected in the direction toward the scintillator. For this, the potential of the middle electrode is 30-500 V positive with respect to the potential of the outer electrode (20).

In the case that the outer electrode (20) is not present, its function is of course fulfilled to some extent by the middle electrode (22).

The detection efficiency for photons is increased by the internal mirror coating of the middle electrode (22), in that those photons that strike the inner surface of the middle electrode are reflected toward the light guide end. A slightly absorbing, light-scattering internal coating of the middle electrode has a similar effect, though with lower efficiency, since with a mirror coating the photons can be deflected specifically toward the light guide.

When a potential difference with respect to the ambient potential is applied to the needle electrode (24), a high field strength occurs at the needle point. This ensures that at a high gas pressure the greater portion of the potential difference is situated on a short path, so that the product of gas pressure and path can be set to the optimum value for a strong gas cascade, and the gas cascade arises predominantly in the detection chamber. In operation with high pressure in the sample chamber, the needle electrode acts as a collector electrode. With a current amplifier connected to the needle electrode, the secondary electron current can also be detected, so that the light guide and photodetector can then be dispensed with if the detector is only to be used at high chamber pressures.

In principle, the same result as with the needle electrode (24) can be attained when instead of it an electrode of plural thin wires (wire thickness below 0.3 mm) stretched parallel to the scintillator electrode (26), or a wire gauze electrode, is arranged closely before the scintillator electrode (26), at a spacing of less than 20 mm, preferably at a spacing of less than 10 mm. In the latter case, the distance between the wire gauze electrode and the scintillator electrode (26) determines the high field strength.

In operation with high pressure (above 500 Pa) in the sample chamber, the potential U3 of the needle electrode (24) is to be at least 200 V positive with respect to the potential of the middle electrode. At average pressures between 1 Pa and 500 Pa, the potential of the needle electrode (24) is to lie between the potential of the middle electrode (22) and the potential of the scintillator electrode (26); it is thereby attained that the gas cascade is somewhat spread apart. In high vacuum operation, the potential of the needle electrode (24) is likewise to lie between the potential of the middle elect rode (22) and the potential of the scintillator electrode (26), but it can however also coincide with the potential of one of the two electrodes (22, 26).

The potential U4 of the scintillator electrode (26) lies at the high voltage potential when operating in high vacuum, as in the other embodiments. At middle chamber pressures, the gas cascade is to end at the needle electrode (24). At high pressure in the sample chamber, the potential of t he scintillator electrode (26) lies between the potential of the needle electrode (24) and that of the middle electrode (22). By this means, a course of the field is attained which on the one hand is helpful as an extraction field in the aperture of the middle electrode (22). On the other hand, the course of the field guides the secondary electrons into the neighborhood of the needle electrode, where they are attracted by the positive potential of the needle electrode.

As in the other embodiments, the scintillator (30) acts in the high vacuum region to produce photons, which are then amplified by a photomultiplier and detected.

The gas feed gives the possibility in the high vacuum region, as in operation with high chamber pressure, of producing a gas cascade in the detection chamber. Furthermore, the gas of the detection chamber can be chosen independently of the gas in the sample chamber, and thereby a gas with a high amplification factor can be chosen for secondary electron multiplication, for a strong gas cascade.

We claim:

1. Detector for a particle beam device to be used in a sample chamber of the particle beam device, comprising:
    a scintillator,
    the scintillator comprising an electrically conductive coating which is designed in strip or grid form,
    a voltage supply by which a high voltage potential is applicable to the electrically conductive coating, and
    a photodetector,
    wherein the detector is arranged and adapted to detect electrons and light, and
    wherein the detector is operable at high vacuum as well as at pressures over $10^{-3}$ hPa in the sample chamber.

2. The detector according to claim 1, further comprising a light guide.

3. The detector according to claim 2, wherein the light guide comprises scintillator material.

4. The detector according to claim 1, further comprising a needle electrode or an electrode of thin wires on a sample side of the scintillator.

5. The detector according to claim 1, further comprising an electrode surrounding the scintillator in a form of a pot that tapers conically to a point on a side remote from the scintillator and comprises an opening on a side remote from the scintillator.

6. The detector of claim 1, wherein with high vacuum in the sample chamber, the detector is operated to detect electrons, and wherein at pressures above $10^{-3}$ hPa the detector is operated to detect light.

7. The detector according to claim 6, further comprising a collector electrode connected before the scintillator.

8. The detector according to claim 7, wherein the scintillator and the collector electrode are controllable potentials, independently of each other.

9. The detector according to claim 7, wherein the collector electrode is arranged and adapted for application of a variable potential, positive with respect to a potential at which a sample is held.

10. The detector according to claim 7, wherein the scintillator comprises a conductive coating, further comprising current amplifiers that are connected to at least one of the collector electrode and to the conductive coating of the scintillator.

11. The detector according to claim 10, wherein the conductive coating of the scintillator is arranged and adapted to have a potential applied with respect to the collector electrode so that a gas cascade arises between the collector electrode and the conductive coating.

12. Detector for a particle beam device to be used in a sample chamber of a charged particle beam device, comprising:
a scintillator,
the scintillator comprising an electrically conductive coating which is permeable to light,
a voltage supply by which a high voltage potential is applicable to the electrically conductive coating, and
a photodetector,
wherein the detector is arranged and adapted to detect electrons and light, and
wherein the detector is operable at high vacuum as well as at pressures over $10^{-3}$ hPa in the sample chamber.

13. The detector of claim 12, wherein with high vacuum in the sample chamber, the detector is operated to detect electrons and wherein at pressures above $10^{-3}$ hPa the detector is operated to detect light.

14. A particle beam device, comprising:
a particle beam optical system generating a focused charged particle beam,
a sample chamber, and
a detector,
wherein the charged particle beam is operable at high vacuum as well as at pressures over $10^{-3}$ hPa in the sample chamber,
wherein the detector comprises
a scintillator,
the scintillator comprising an electrically conductive coating which is permeable to light,
a voltage supply by which a high voltage potential is applicable to the electrically conductive coating, and
a photodetector,
wherein the detector is arranged and adapted to detect electrons and light.

15. The detector of claim 14, wherein with high vacuum in the sample chamber, the detector is operated to detect electrons and wherein at pressures above $10^{-3}$ hPa the detector is operated to detect light.

16. The particle beam device of claim 14, wherein the particle optical system is an electron optical system generating a focused electron beam.

17. A particle beam device, comprising:
a particle beam optical system generating a focused charged particle beam,
a sample chamber, and
a detector,
wherein the charged particle beam is operable at high vacuum as well as at pressures over $10^{-3}$ hPa in the sample chamber,
wherein the detector comprises
a scintillator,
the scintillator comprising an electrically conductive coating which is designed in strip or grid form,
a voltage supply by which a high voltage potential is applicable to the electrically conductive coating, and
a photodetector,
wherein the detector is arranged and adapted to detect electrons and light.

18. The detector of claim 17, wherein with high vacuum in the sample chamber, the detector is operated to detect electrons and wherein at pressures above $10^{-3}$ hPa the detector is operated to detect light.

19. The particle beam device of claim 17, wherein the particle optical system is an electron optical system generating a focused electron beam.

20. A particle beam device comprising:
a sample chamber,
a particle beam optical system generating a focused charged particle beam,
wherein the charged particle beam is operable at varying pressures in the sample chamber,
a pressure meter arranged in the sample chamber, and
a detector, the detector comprising a scintillator and the scintillator comprising an electrically conductive coating, and whereby the detector is arranged and adapted to detect electrons and light,
the detector further comprising a voltage supply by which a high voltage potential is applicable to the electrically conductive coating,
a control by which the application of electrical potential to the electrically conductive coating is controlled in dependence of the pressure in the sample chamber.

21. The particle beam device according to claim 20, wherein at pressures in the sample chamber below a changeover pressure between $10^{-3}$ hPa and $10^{-2}$ hPa, a potential of greater than 1 kV positive with respect to the potential of a sample is applied to the scintillator, and at pressures in the sample chamber above the changeover pressure, a potential quantitatively smaller than 1 kV positive with respect to the potential of the sample is applied to the scintillator.

22. The particle beam device according to claim 21, wherein at pressures above the changeover pressure in the sample chamber, a potential of 0 V or ±400 V with respect to the potential of the sample is applied to a collector electrode.

23. The particle beam device according to claim 21, wherein the potential is quantitatively smaller than 0.5 kV.

24. The particle beam device according to claim 20, the detector further comprising a collector electrode, and an electrical potential of varying polarities being applicable to the collector electrode.

* * * * *